United States Patent
Lee

(10) Patent No.: US 8,421,063 B2
(45) Date of Patent: Apr. 16, 2013

(54) ORGANIC LIGHT EMITTING DISPLAY

(75) Inventor: Keun-Soo Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 175 days.

(21) Appl. No.: 12/847,127

(22) Filed: Jul. 30, 2010

(65) Prior Publication Data
US 2011/0024756 A1    Feb. 3, 2011

(30) Foreign Application Priority Data
Jul. 30, 2009   (KR) .................. 10-2009-0069926

(51) Int. Cl.
*H01L 35/24*    (2006.01)
*H01L 33/00*    (2010.01)
*G02F 1/33*     (2006.01)

(52) U.S. Cl.
USPC ........... 257/40; 257/88; 257/E51.018; 349/33

(58) Field of Classification Search ............... 257/59, 257/758, E51.018, 40, 79, 88; 313/504, 505, 313/506; 345/76; 349/40, 83, 139, 146, 349/33, 38, 69
See application file for complete search history.

(56) References Cited

U.S. PATENT DOCUMENTS

| 7,230,667 B2 * | 6/2007 | Shin et al. ............. 349/146 |
| 2005/0287750 A1 * | 12/2005 | Lee ............. 438/301 |
| 2008/0203931 A1 * | 8/2008 | Kim ............. 315/169.3 |

FOREIGN PATENT DOCUMENTS

| KR | 10-2005-0001747 | 1/2005 |
| KR | 10-2006-0000848 A | 1/2006 |
| KR | 1020060000362 | 1/2006 |
| KR | 1020060046811 | 5/2006 |
| KR | 10-0766949 | 10/2007 |

OTHER PUBLICATIONS

Korean Office Action issued by Korean Patent Office on Feb. 14, 2011. Korean Patent Application No. 10-2009-0069926 and "Request for Entry of the Accompanying Office Action" attached herewith.
Korean Notice of Allowance issued by KIPO on Sep. 21, 2011 in connection with Korean Patent Application Serial No. 10-2009-0069926 and Request for Entry of the Accompanying Office Action attached herewith.

* cited by examiner

*Primary Examiner* — Nikolay Yushin
(74) *Attorney, Agent, or Firm* — Robert E. Bushnell, Esq.

(57) ABSTRACT

The general inventive concept relates to an organic light emitting display that has the same area where the upper and lower electrodes of a capacitor are overlapped for adjacent pixels, for respective pixels that constitute the organic light emitting display but implements the sizes of the upper and lower electrodes to be different. This thereby prevents the display quality of horizontal line shaped spot generated due to the effects of a critical dimension (CD) distribution from being degraded.

14 Claims, 3 Drawing Sheets

ORGANIC LIGHT EMITTING DISPLAY

CLAIM OF PRIORITY

This application makes reference to, incorporates the same herein, and claims all benefits accruing under 35 U.S.C. §119 from an application earlier filed in the Korean Intellectual Property Office on 30 Jul. 2009 and there duly assigned Serial No. 10-2009-0069926.

BACKGROUND OF THE INVENTION

1. Field of the Invention

The general inventive concept relates to an organic light emitting display, and more particularly, to an organic light emitting display that prevents the display quality of horizontal line shaped spot generated due to the effects of a critical dimension (CD) distribution from being degraded.

2. Description of the Related Art

Recently, flat panel displays (FPD), which solve weight and volume disadvantages of the cathode ray tube (CRT), and have the advantages of being compact and lightweight, have been spotlighted. Among flat panel displays, there are liquid crystal displays (LCD), organic light emitting diode displays (OLED), field emitter displays (FED), plasma display panels (PDP), etc.

Among other advantages, the organic light emitting display has advantages in that it has a wider use temperature range and is stronger against impact or vibration when compared to other flat panel displays. It also has a wide viewing angle and a rapid response speed which enable it to provide a clean moving image, and it has therefore been spotlighted as a next generation flat panel display.

The organic light emitting display is a display using the phenomenon that when an electron and a hole injected into a thin film of an organic material through an anode and a cathode are recombined, they form an exciton, and light having a specific wavelength is generated from the exciton. The organic light emitting display as described above is constituted using self-light emitting elements, so that it does not require a separate light source in contrast to a liquid crystal display. The brightness of the organic light emitting elements that constitute the organic light emitting display are controlled by the amount of current flowing in the organic light emitting elements.

Therefore, since the brightness of the organic light emitting display is controlled by the amount of current flowing in the organic light emitting elements, a more precise deposition process should be performed when forming the respective pixels.

The respective pixels of the organic light emitting display are made by including various constituents such as a transistor, a capacitor, etc., wherein they are formed through a deposition process using a shadow mask or a fine metal mask (FMM).

In this case, the capacity of the capacitor for each pixel may be different due to the critical dimension distribution which is generated as a result of the deposition process using the mask.

For example, in the case of a capacitor formed on the scan line for each pixel region, a problem arises in that a horizontal line shaped spot is generated according to the CD distribution generated in forming the electrode of the capacitor.

In order to reduce the effects of the CD distribution, there is a method to lower the tolerance of the mask, that is, to manufacture the mask more precisely, but this method is disadvantageous in view of considerably higher manufacturing costs.

SUMMARY OF THE INVENTION

An embodiment of the invention provides an organic light emitting display that has the same area where the upper and lower electrodes of a capacitor are overlapped per adjacent pixels for respective pixels that constitute the organic light emitting display but implements the sizes of the upper and lower electrodes to be different, thereby preventing the display quality of horizontal line shaped spot generated due to the effects of a critical dimension (CD) distribution from being degraded.

According to one aspect, there is provided an organic light emitting display that includes at least one capacitor for each pixel, including: a semiconductor layer that is formed on a substrate and serves as a lower electrode of the capacitor; a dielectric layer formed on the semiconductor layer; and a first electrode layer that serves as an upper electrode of the capacitor formed in the region on the dielectric layer overlapped with the semiconductor layer, wherein the width of the semiconductor layer and the width of the first electrode layer overlapped therewith are implemented to be different per adjacent pixels.

Further, the adjacent pixels may be an odd pixel of the pixels arranged per respective scan line and an even pixel adjacent to the odd pixel, wherein in the capacitor provided in the even pixel, the width of the semiconductor layer is formed to be wider than the width of the first electrode, and in the capacitor provided in the odd pixel, the width of the first electrode is formed to be wider than the width of the semiconductor layer.

Moreover, the first electrode layer may be coupled to the scan lines arranged in a row direction to be implemented in a form where a portion thereof is projected from the scan lines, and the capacitor may be a boosting capacitor Cb that is provided in each pixel.

With the embodiment as described above, the organic light emitting display has the same area where the upper and lower electrodes of a capacitor are overlapped per adjacent pixels for respective pixels that constitute the organic light emitting display but implements the sizes of the upper and lower electrodes to be different. Therefore, the above described embodiment of the invention has the advantage of preventing the display quality of horizontal line shaped spot generated from being degraded due to the effects of a critical dimension (CD) distribution.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
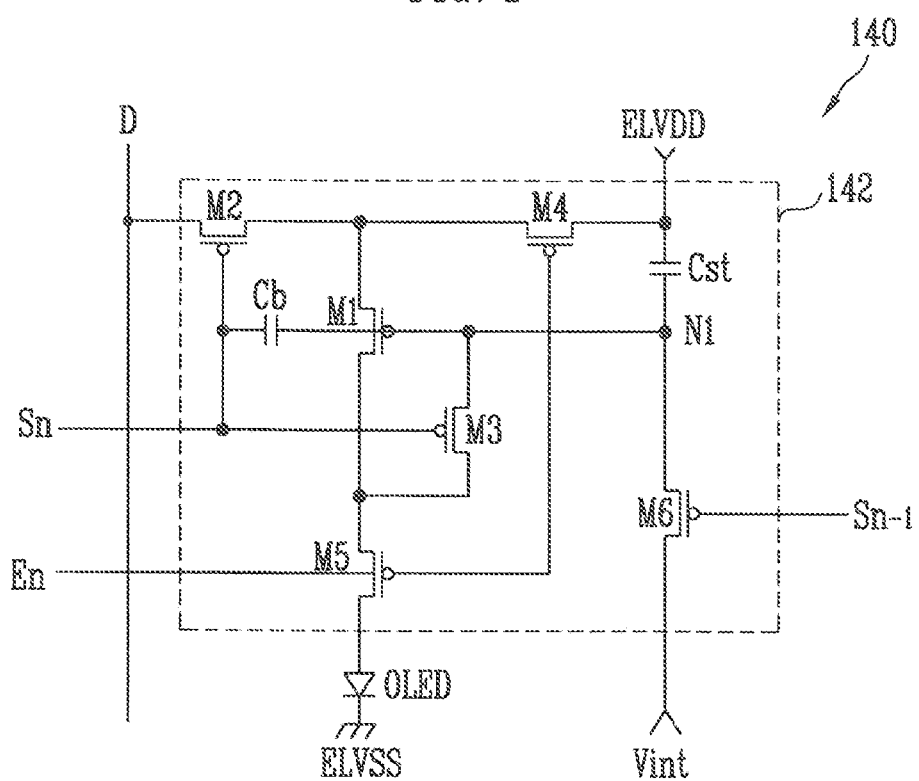
FIG. 1 is a circuit view of each pixel of an organic light emitting display according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed in between. Also, when an element is referred to as being "connected to" another element, it can be directly connected to the other element or be indirectly connected to the other element with one or more intervening elements interposed in between. Hereinafter, like reference numerals refer to like elements.

Hereinafter, exemplary embodiments according to the present invention will be described with reference to the accompanying drawings.

Figure 4:
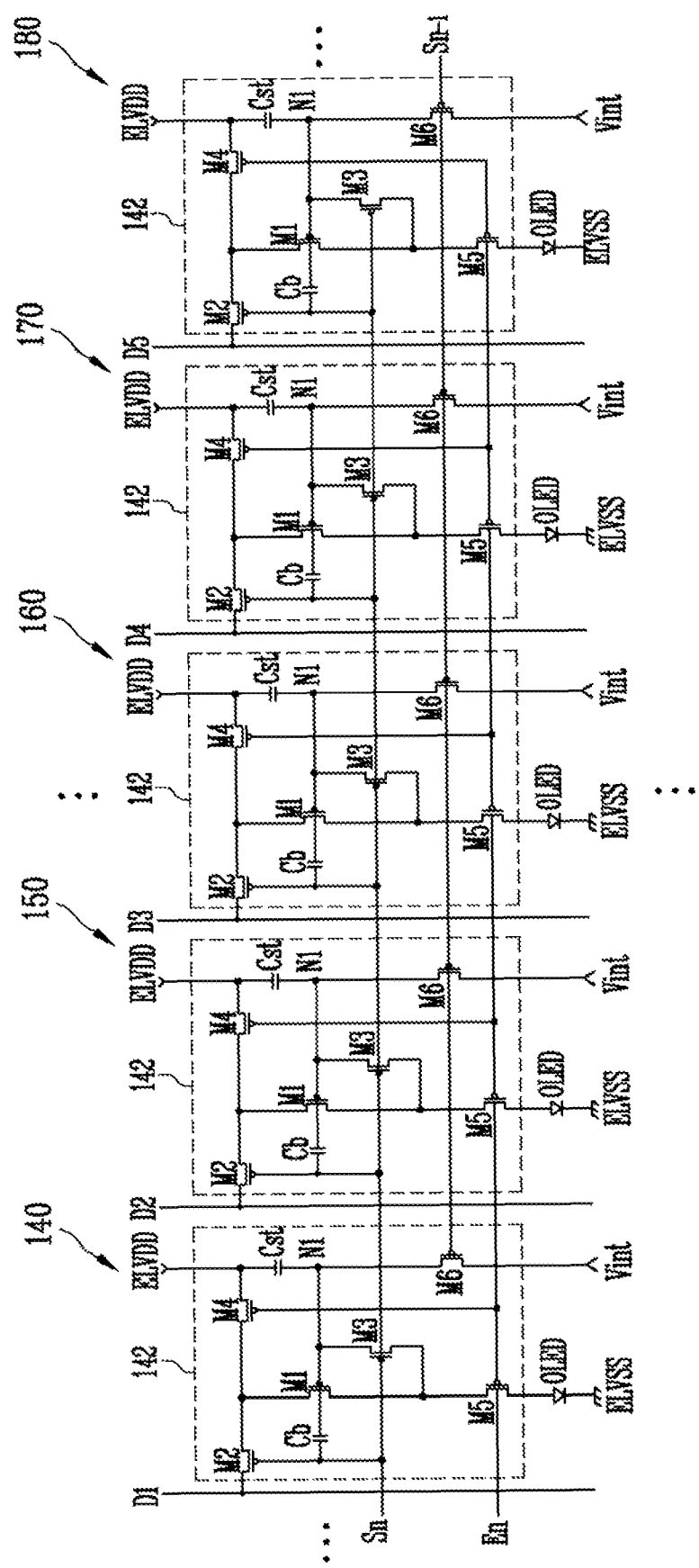
FIG. 4 is a circuit view of pixels of an organic light emitting display according to an embodiment of the present invention.

FIG. 1 is a circuit view of each pixel of an organic light emitting display according to an embodiment of the present invention. FIG. 4 is a circuit view of pixels of an organic light emitting display according to an embodiment of the present invention.

However, pixels shown in FIG. 1 and FIG. 4 are merely one embodiment of the invention. The pixels provided in the organic light emitting display according to the embodiment shown in FIG. 1 and FIG. 4 are not always limited thereto.

Referring to FIG. 4, pixels 140, 150, 160, 170, and 180 each include a pixel circuit 142. The pixels 140, 160, and 180 are odd pixels; and the pixels 150 and 170 are even pixels. Referring to FIG. 1, the pixels 140 according to an embodiment of the present invention include an organic light emitting diode OLED and a pixel circuit 142 that is coupled to a data line D, a scan line Sn, and a light emitting control line En to control the organic light emitting diode OLED.

The anode electrode of the organic light emitting diode OLED is coupled to the pixel circuit 142 and the cathode electrode thereof is coupled to a second power supply ELVSS. The second power supply ELVSS is set to a voltage lower than that of a first power supply ELVDD. Such an organic light emitting diode OLED generates light having any one of red, green and blue corresponding to the amount of current supplied from the pixel circuit 142.

The pixel circuit 142 includes a storage capacitor Cst and a sixth transistor M6 coupled between the first power supply ELVDD and an initialization power supply Vint, a fourth transistor M4, a first transistor M1, and a fifth transistor M5 coupled between the first power supply ELVDD and the organic light emitting diode OLED, a third transistor M3 coupled between the gate electrode and the second electrode of the first transistor M1, a second transistor M2 coupled between the data line D and the first electrode of the first transistor M1, and a boosting capacitor Cb coupled between the gate electrode of the first transistor M1 and the gate electrode of the second transistor M2.

Herein, the first electrode is set to any one of the drain electrode and the source electrode, and the second electrode is set to an electrode other than the first electrode. For example, if the first electrode is set to the source electrode, the second electrode is set to the drain electrode. Furthermore, although the first to sixth transistors M1 to M6 are illustrated as P-type MOSFET's in FIG. 1, the embodiment is not limited thereto.

If the first to sixth transistors M1 to M6 are N type MOSFET's, the polarity of the driving waveform is inversed as known to those skilled in the art.

The first electrode of the first transistor M1 is coupled to the first power supply ELVDD via the fourth transistor M4, and the second electrode thereof is coupled to the organic light emitting diode OLED via the fifth transistor M5. The gate electrode of the first transistor M1 is coupled to a first node N1. Such a first transistor M1 supplies the voltage charged in a storage capacitor Cst, that is, the current corresponding to the voltage applied to the first node N1, to the organic light emitting diode OLED.

The first electrode of the third transistor M3 is coupled to the second electrode of the first transistor M1, and the second electrode thereof is coupled to the gate electrode of the first transistor M1. And, the gate electrode of the third transistor M3 is coupled to the s scan line Sn. When the scan signal is supplied to the n scan line Sn, such a third transistor M3 is turned on to couple the first transistor M1 in a diode form. In other words, when the third transistor M3 is turned on, the first transistor M1 is coupled in a diode form.

The first electrode of the second transistor M2 is coupled to the data line D, and the second electrode thereof is coupled to the first electrode of the first transistor M1. The gate electrode of the second transistor M2 is coupled to the n scan line Sn. When the scan signal is supplied to the n scan line Sn, such a second transistor M2 is turned on to supply the data signal supplied to the data line D to the first electrode of the first transistor M1.

The first electrode of the fourth transistor M4 is coupled to the first power supply ELVDD, and the second electrode thereof is coupled to the first electrode of the first transistor M1. The gate electrode of the fourth transistor M4 is coupled to the light emitting control line En. When the light emitting control signal is not supplied (that is, when the low light emitting control signal is supplied), the fourth transistor M4 is turned on to couple the first power supply ELVDD electrically to the first transistor M1.

The first electrode of the fifth transistor M5 is coupled to the first transistor M1, and the second electrode thereof is coupled to the organic light emitting diode OLED. The gate electrode of the fifth transistor M5 is coupled to the light emitting control line En. When the light emitting control signal is not supplied (that is, when the low light emitting control signal is supplied), the fifth transistor M5 is turned on to couple the first transistor electrically to the organic light emitting diode OLED.

The first electrode of the sixth transistor M6 is coupled to the storage capacitor Cst and the gate electrode of the first transistor M1 (that is, the first node N1), and the second electrode thereof is coupled to the initialization power supply Vint. The gate electrode of the sixth transistor M6 is coupled to an n−1 scan line Sn−1. When the scan signal is supplied to the n−1 scan line Sn−1, the sixth transistor M6 is turned on to initialize the first node N1. To this end, the voltage value of the initialization power supply Vint is set to be lower than the voltage value of the data signal.

The storage capacitor Cst is coupled between the first power supply ELVDD and the first node N1, wherein the voltage corresponding to the data signal input per pixel is stored therein.

Further, the boosting capacitor Cb is coupled between the first node N1 and the n scan line Sn. The boosting capacitor Cb is provided in order to solve the problem that the data signal stored in the storage capacitor Cst is charged with the voltage lower than the desired voltage to lead in accuracy in displaying low gray scale. Therefore, the boosting capacitor Cb serves to increase the voltage of the first node N1 when the supply of the scan signal stops, making it possible to solve the problem.

Figure 2:
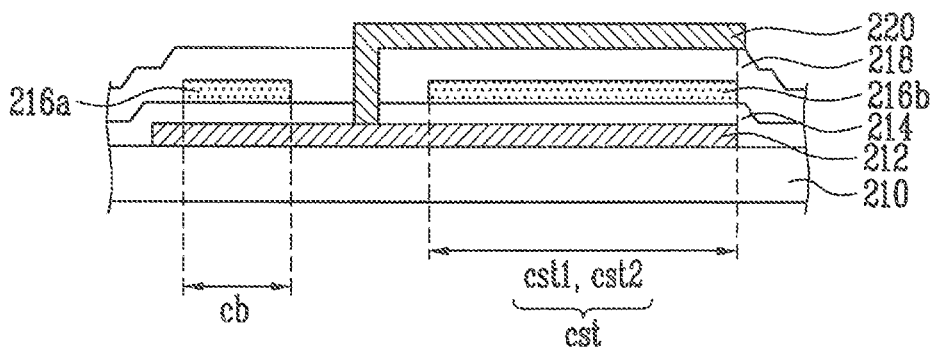
FIG. 2 is a cross-sectional view showing capacitors formed in each pixel of FIG. 1.

FIG. 2 is a cross-sectional view showing capacitors formed in each pixel of FIG. 1. Although only capacitors are illustrated in FIG. 2 for convenience, a plurality of transistors are additionally formed in each actual pixel.

Referring to FIG. 2, each pixel of the embodiment includes a semiconductor layer 212, a first electrode layer 216a, a second electrode layer 216b, and a third electrode layer 220, that are formed on a substrate 210 to form the capacitors Cb and Cst. In other words, at least one of the capacitors Cb and Cst may be formed in a dual capacitor form so that it may secure sufficient capacity.

Moreover, each pixel further includes a first dielectric layer 214 and a second dielectric layer 218 so that the semiconductor layer 212, the first electrode layer 216a, the second electrode layer 216b, and the third electrode layer 220 can be isolated therefrom.

First, the semiconductor layer 212 is formed on the substrate 210. The semiconductor layer 212, which is formed using the same material as that of a semiconductor layer forming the channel of the transistors, is formed simultaneously with the transistor channel and serves as the lower electrode of the capacitor. As an example, the semiconductor layer 212 can be made of poly-Si.

After the semiconductor layer 212 is formed on the substrate 210, the first dielectric layer 214 is formed on the semiconductor layer 212. The first dielectric layer 214 isolates the first electrode layer 216a and the second electrode layer 216 to be formed later from the semiconductor layer 212.

Thereafter, the first electrode layer 216a is formed in the region where the boosting capacitor Cb is formed simultaneously with forming the second electrode layer 216b in the region where the storage capacitor Cst is formed. In this case, the capacity of the storage capacitor Cst is set to be larger than the capacity of the boosting capacitor Cb so that the length of the second electrode layer 216b is set to be longer than the length of the first electrode layer 216a. Meanwhile, the first electrode layer 216a and the second electrode layer 216b are made of the same material as that of the gate electrodes of the transistors and the scan line.

In particular, the first electrode layer 216a is implemented by being coupled to the scan line as shown in FIG. 1. In other words, the first electrode layer 216a is formed in a shape where a portion thereof is projected from the scan line per pixel coupled to the scan lines for the scan lines arranged in a row direction.

After the first electrode layer 216a and the second electrode layer 216b are formed, the second dielectric layer 218 is formed to cover the first electrode layer 216a and the second electrode layer 216b. The second dielectric layer 218 isolates the first electrode layer 216a and the second electrode layer 216b electrically from a third electrode layer 220 to be formed later.

After the second dielectric layer 218 is formed, a contact hole is formed so that the semiconductor layer 212 is exposed between the first dielectric layer 216a and the second dielectric layer 216b. And, a third electrode layer 220 is formed to be coupled to the semiconductor layer 212 through the contact hole.

Herein, the third electrode layer 220 is formed to implement a dual capacitor. The capacity of the storage capacitor Cst is set to be larger than the capacity of the boosting capacitor Cb so that the third electrode layer 220 is formed on the position overlapped with the second electrode layer 216b, as shown in the drawing.

If the third electrode layer 220 is formed as described above, the forming of the storage capacitor Cst and the boosting capacitor Cb is completed.

In other words, the boosting capacitor Cb is formed through the region where the semiconductor layer 212 is overlapped with the first electrode layer 216a, and the storage capacitor Cst is formed through the region where the semiconductor layer 212 is overlapped with the second electrode layer 216b and the region where the second electrode layer 216b is overlapped with the third electrode layer 220.

In the case of the pixel described with reference to FIGS. 1 and 2, the upper electrode 216a of the boosting capacitor Cb is implemented in the form to be coupled to the scan line. Therefore, during the process of forming the upper or the lower electrode of the boosting capacitor Cb, a problem may arise in that a horizontal line shaped spot per scan line may be generated according to the CD distribution.

In other words, there may be a difference in the overlapped area of the upper electrode and the lower electrode that determines the capacity of the boosting capacitor according to the CD distribution. In this case, the capacity of the boosting capacitor becomes different so that a horizontal line shaped spot may be displayed.

In order to solve the problem, an embodiment of the present invention has the same area where the upper and the lower electrodes of the boosting capacitor are overlapped per adjacent pixels for the pixels arranged per the respective scan lines but alternately arranges the pixels so that the sizes of the upper and the lower electrodes of the capacitor become different. Therefore, although the CD distribution is generated in the process of forming any one layer, that is, any one electrode of the upper electrode and the lower electrode, the embodiment can prevent line spot from being generated in the entirety in the row direction.

Figure 3A:
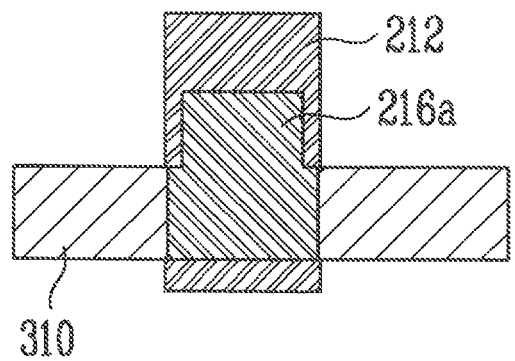
FIGS. 3A and 3B are plan views of a boosting capacitor according to an embodiment of the present invention.
Figure 3B:
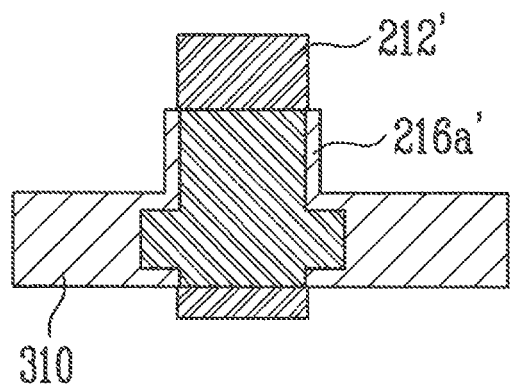

FIGS. 3A and 3B are plan views of a boosting capacitor according to an embodiment of the present invention.

First, referring to FIG. 3A, the width of the semiconductor layer 212 serving as the lower electrode is formed to be wider than the width of the first electrode layer 216a serving as the upper electrode.

At this time, the first electrode layer 216a is implemented in the form where it is coupled to the scan line 310 and a portion thereof is projected from the scan line 310, as described with reference to FIG. 2.

In other words, in FIG. 3A, the capacity of the boosting capacitor Cb is determined by the overlapped area of the semiconductor layer 212 and the first electrode layer 216a.

In this case, since the width of the semiconductor layer 212 is formed to be wider than the width of the first electrode layer 216a, the overlapped area becomes different according to the CD distribution when forming the first electrode layer 216a so that the capacity of the boosting capacitor Cb becomes different.

In other words, when the width of the first electrode layer 216a becomes narrow according to the CD distribution, the overlapped area of the semiconductor layer 212 and the first electrode layer 216a becomes small and makes the capacity of the boosting capacitor Cb small.

Next, referring to FIG. 3B, the width of the first electrode 216a' serving as the upper electrode is formed to be wider than the width of the semiconductor layer 212' serving as the lower electrode.

In this case, since the width of the first electrode layer 216a' is formed to be wider than the width of the semiconductor layer 212', the overlapped area becomes different according to the CD distribution when forming the semiconductor layer 212' so that the capacity of the boosting capacitor Cb becomes different.

In other words, when the width of the semiconductor layer 212' becomes narrow according to the CD distribution, the overlapped area of the semiconductor layer 212' and the first electrode layer 216a' becomes small and makes the capacity of the boosting capacitor Cb small.

Therefore, the embodiment has the same area where the upper and lower electrodes of the boosting capacitor are overlapped per adjacent pixels for the pixels arranged per the respective scan lines but allows the even pixels per the respective scan lines to adopt the boosting capacitor shown in FIG. 3A and allows the odd pixels per the respective scan lines to adopt the boosting capacitor shown in FIG. 3B so that the sizes of the upper and lower electrodes become different. Therefore, although a CD distribution is generated in the process of forming any one layer, that is, any one electrode of the upper electrode and the lower electrode, the embodiment can prevent the horizontal line spot from being generated in the entirety in the row direction.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display that includes at least one capacitor for each pixel, comprising:
    a semiconductor layer on a substrate that serves as a lower electrode of a capacitor;
    a dielectric layer disposed on the semiconductor layer; and
    a first electrode layer that serves as an upper electrode of the capacitor disposed in the region on the dielectric layer overlapped with the semiconductor layer, wherein the width of the semiconductor layer and the width of the first electrode layer overlapped therewith are different for adjacent pixels.

2. The organic light emitting display as claimed in claim 1, wherein the first electrode layer is made of the same material as a scan line and projects from a scan line.

3. The organic light emitting display as claimed in claim 1, wherein the capacitor is a boosting capacitor that is provided in each pixel.

4. The organic light emitting display as claimed in claim 1, wherein the adjacent pixels are an odd pixel of the pixels arranged per respective scan line and an even pixel adjacent to the odd pixel.

5. The organic light emitting display as claimed in claim 4, wherein in the capacitor provided in the even pixel, the width of the semiconductor layer is wider than the width of the first electrode layer.

6. The organic light emitting display as claimed in claim 4, wherein in the capacitor provided in the odd pixel, the width of the first electrode layer is wider than the width of the semiconductor layer.

7. An organic light emitting display that includes odd pixels and even pixels arranged on a scan line and at least one capacitor for each pixel, comprising:
    a semiconductor layer on a substrate that serves as a lower electrode of a capacitor;
    a dielectric layer disposed on the semiconductor layer;
    a first electrode layer that serves as an upper electrode of the capacitor disposed in the region on the dielectric layer overlapped with the semiconductor layer; and
    in even pixels on the scan line, the width of the semiconductor layer is wider than the width of the first electrode layer;
    in odd pixels adjacent to an even pixel on the scan line, the width of the first electrode layer is wider than the width of the semiconductor layer.

8. The organic light emitting display of claim 7, wherein the first electrode layer is made of the same material as a scan line and projects from a scan line.

9. The organic light emitting display of claim 7, wherein the capacitor for each pixel is a boosting capacitor.

10. The organic light emitting display of claim 7, wherein the semiconductor layer comprises poly-Si.

11. The light emitting display of claim 7, wherein each pixel further comprises a storage capacitor.

12. The light emitting display of claim 11, wherein the storage capacity of the storage capacitor is larger than the storage capacity of the booster capacitor.

13. The light emitting display of claim 7, wherein each pixel comprises at least one transistor.

14. The light emitting display of claim 13, wherein the semiconductor layer comprises the same material as the channel of a transistor.

* * * * *